United States Patent
Cook, Jr.

(10) Patent No.: US 7,145,121 B1
(45) Date of Patent: Dec. 5, 2006

(54) MONOLITHIC SILICON INTEGRATED CIRCUIT FOR DETECTING AZIMUTH AND ELEVATION OF INCIDENT RADIATION AND METHOD FOR USING SAME

(76) Inventor: Koy B. Cook, Jr., 2804 Barcody Rd., Huntsville, AL (US) 35801

( * ) Notice: Subject to any disclaimer, the term of this patent is extended or adjusted under 35 U.S.C. 154(b) by 0 days.

(21) Appl. No.: 11/061,588

(22) Filed: Feb. 18, 2005

Related U.S. Application Data

(63) Continuation-in-part of application No. 09/928,388, filed on Aug. 13, 2001, now abandoned.

(60) Provisional application No. 60/224,625, filed on Aug. 11, 2000.

(51) Int. Cl.
  G01C 21/24   (2006.01)
  G01C 21/02   (2006.01)
  G01J 1/20    (2006.01)
  H01L 31/00   (2006.01)

(52) U.S. Cl. .................... 250/203.1; 250/214.1

(58) Field of Classification Search .......... 250/203.1, 250/206.1, 206.2, 214.1, 214 R; 356/141.5, 356/147, 139.01
See application file for complete search history.

(56) References Cited

U.S. PATENT DOCUMENTS

| | | | |
|---|---|---|---|
| 4,107,521 A | 8/1978 | Winders | |
| 4,593,187 A | 6/1986 | Grotts et al. | |
| 4,611,914 A | 9/1986 | Homma | |
| 5,010,244 A | 4/1991 | Nissborg | |
| 5,264,691 A | 11/1993 | Hegyi | |
| 5,517,017 A * | 5/1996 | Yamada et al. | 250/203.4 |
| 5,572,316 A | 11/1996 | Zaffanella et al. | |
| 6,043,778 A | 3/2000 | Froeberg et al. | |
| 6,078,080 A | 6/2000 | Kadosh et al. | |
| 6,198,168 B1 | 3/2001 | Geusic et al. | |
| 6,201,234 B1 * | 3/2001 | Chow et al. | 250/214 LS |
| 6,218,888 B1 | 4/2001 | Otsuki | |
| 6,233,368 B1 | 5/2001 | Dadyal et al. | |
| 6,396,047 B1 * | 5/2002 | Sumiya et al. | 250/214 R |

* cited by examiner

OTHER PUBLICATIONS

Venler, Landolt, DeBergh, Arreguit, "Analog CMOS Photosensitive Array for Solar Illumination Monitoring," Solid State Circuit Conf.

*Primary Examiner*—Stephone B. Allen
*Assistant Examiner*—Patrick J. Lee
(74) *Attorney, Agent, or Firm*—Lanier Ford Shaver & Payne PC; Angela Holt; Frank M. Caprio

(57) ABSTRACT

A device for detecting radiation direction is an integrated circuit that includes a first and second phototransistor positioned anti-parallel with respect to each other and a reference phototransistor. The device does not require impinging radiation to be mechanically aligned using pinholes, apertures or mechanical slits. The first phototransistor detects the direction of the radiation in an x-plane, and the second phototransistor detects the direction of the radiation in the y-plane. The first and second phototransistors have two differential pairs. The P type base regions are formed in the <111> plane of the silicon to form opposing sidewalls for receiving radiation signals from a radiation source. A current is induced in the PN junction of each phototransistor, thereby causing a current output on the emitters of the phototransistors. The differential currents represent rectangular coordinates describing the direction of the radiation detected on the <111> plane. The reference transistor is a <100> plane phototransistor, and its single current output is used to normalize the differential outputs of the first and second phototransistors. A system that integrates the detection device to determine the azimuth and elevation (spherical coordinates) of the impinging radiation includes a device that translates the normalized current outputs (rectangular coordinates) into spherical coordinates.

16 Claims, 13 Drawing Sheets

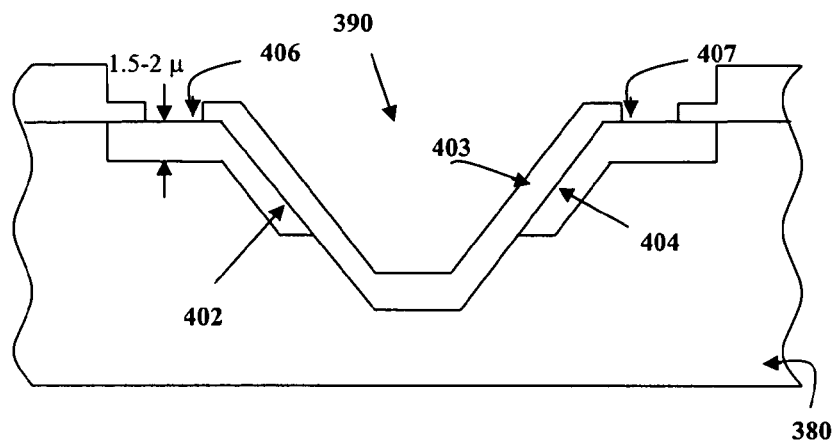
FIGURE 10G
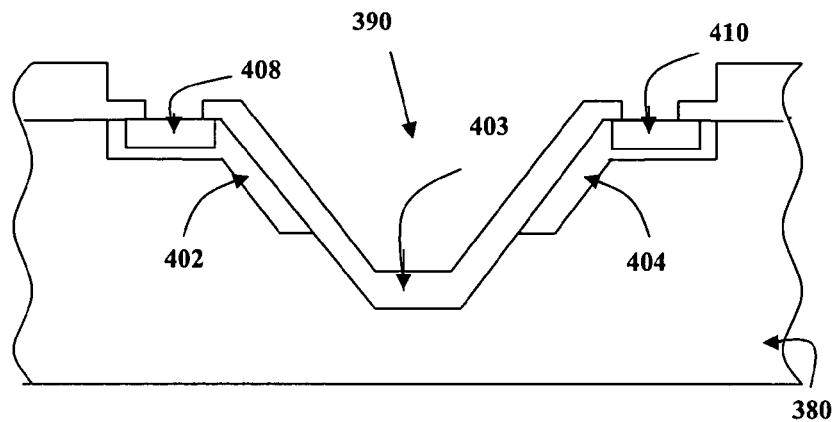
FIGURE 10H
FIGURE 10I
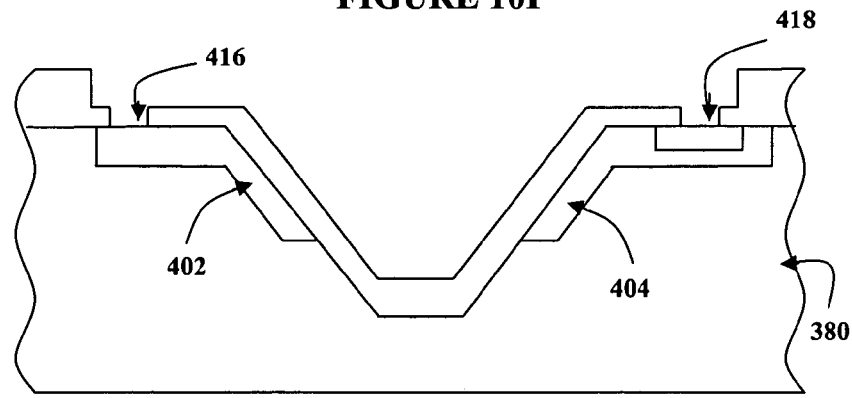

MONOLITHIC SILICON INTEGRATED CIRCUIT FOR DETECTING AZIMUTH AND ELEVATION OF INCIDENT RADIATION AND METHOD FOR USING SAME

CROSS-REFERENCE TO RELATED APPLICATIONS

This application claims the benefit of U.S. Provisional Application No. 60/224,625, filed Aug. 11, 2000, now abandoned, and entitled "RADIATION SENSING INTEGRATED CIRCUIT DEVICE AND METHOD" and U.S. Non-Provisional application Ser. No. 09/928,388, filed Aug. 13, 2001, and entitled "RADIATION SENSING INTEGRATED CIRCUIT DEVICE AND METHOD". Both of these applications are fully incorporated herein by reference.

BACKGROUND OF THE INVENTION

The present invention relates generally to the field of sensing devices, their use and methods for their manufacture, and more particularly, to a radiation sensing planar monolithic silicon integrated circuit for determining the azimuth and elevation of incident radiation. The device and method is particularly well suited for integration in a single planar monolithic silicon IC (Integrated Circuit) chip along with additional circuitry for use in navigation, guidance and control systems, for example systems in space or used for space exploration, or other systems including positional control of systems relative to incoming radiation. The present invention relates to a particular class of radiation sensing devices called sun pointers and is useful as part of a miniaturized system for space navigation for satellites, particularly very small satellites, or other exploratory space vehicles, including robotics, where size, low power, low signal level (optical and electronic) sensitivity, angular sensitivity (ability to detect very small changes in azimuth and elevation of incident radiation), large dynamic range and an ability to minimize the number of constituent parts is important.

Light (radiation) inherently contains direction and amplitude characteristics. Consequently, light (radiation), when properly detected and analyzed, is useful in navigational and positional control applications. Sensors that function in response to incident radiation are known in the art. One example of a guidance or positioning system that uses a light or radiation source such as the sun for positioning is known in the art as a sun pointer. Sun pointers provide the azimuth and elevation of the sun relative to a space platform's location and thus provide necessary information for navigation in space. Monolithic silicon integrated circuit chips manufactured with state of the art planar technology are known to provide the greatest degree of miniaturization of electronic functions while at the same time providing large sensitivity to detecting small electronic signals and simultaneously providing large dynamic range. A sun (radiation) pointing device is disclosed which combines sun pointing capability within a single planar monolithic silicon IC chip, without mechanical apertures or pin holes for directing incident radiation, with large dynamic range, with state of the art angular, electrical and optical sensitivity and which can be reduced in size (miniaturized) or scaled to nanometer dimensions the same as state of the art monolithic silicon IC technology U.S. Pat. No. 4,611,914, entitled Sunbeam Incident Angle Detecting Device, illustrates a sun pointer system for determining position relative to a light source. The technology disclosed in the '914 patent uses a pair of solar cells disposed at a known angle, other than zero, to each other. When radiation impinges, the current produced by the radiation in the solar cells is used to determine the incident angle of the radiation. This angle is then used to determine the relative position of a satellite to a light source.

Efforts to reduce the size of sun pointing devices or systems such as disclosed in the '914 patent have utilized various technologies including microelectronics. In all cases the reduction efforts have resulted in structures in which the radiation detecting elements are fabricated essentially in a single plane. Even in cases where there is more than a single radiation detecting element and even when these various radiation detecting elements are placed at different angles relative to each other and including orthogonal placement, the radiation detecting elements are still essentially located in a single plane. This has resulted in devices with mechanical slits, pinholes or alignment apertures to direct impinging radiation (sun light) using mechanical alignment and to prevent the impinging radiation from striking the entire photo detecting element surface. Azimuth and elevation information on the incident radiation is only available in such mechanical alignment systems or devices if the radiation is positionally directed, by an aperture, slit or pinhole system, onto the detecting elements in a particular manner.

One such existing sun pointer system employs electro-optical sensing devices in conjunction with mechanical alignment to guide the impinging light or radiation relative to the electro-optical sensors. FIG. 1 of the present invention illustrates a sun pointer system that employs such a prior art design. The sensing element of the system is a photodiode array. Light (radiation) impinges the array through a mechanical entrance slit providing direction and amplitude information to the system via photocell output signals, amplifiers, and buffer storage.

Pointing systems of this type require that the impinging radiation (light) pass through a mechanical aperture to control where the radiation strikes the photo diode array or detector surfaces. Such a mechanical opening is an integral part of such sensors and azimuth and elevation information cannot be obtained without them. As such, the mechanical pinhole, aperture or slit serves as a major limitation of such systems. This makes the systems, even those which are miniaturized to some extent, incompatible with being integrated into a single monolithic silicon integrated circuit chip using modern planar technology, makes the systems physically larger than otherwise required since the mechanical apertures must reside a fixed physical distance from the photo detector/sensor surface or the plane of the photo detector/sensor surfaces, reduces (sets a limit to) the sensitivity of the basic device to very small changes in directional information in the incident radiation and limits the ability to scale or shrink the device to smaller dimensions to be compatible with and integrated in a nanoscale monolithic silicon IC chip.

U.S. Pat. No. 5,517,017 (the '017 patent or Yamada) uses a form of mechanical aperture. In one embodiment, they use a pinhole (see FIGS. 2 and 4) and in another embodiment different shaped apertures, but all are essentially mechanical apertures to direct light onto a set of surface photo detectors essentially in one surface plane. In addition, the detectors in this patent are photo diodes which have no amplification and thus will not be capable of detecting small radiation signals to the same level or degree as devices with integral amplification. Further, the '017 patent relates to a device made with thin film hybrid technology and cannot be reduced in size or scale to the same degree as a monolithic silicon IC chip and cannot be integrated into a single monolithic silicon IC chip.

The existing technology for determining azimuth and elevation of incident radiation which relies on radiation traveling through a pinhole, aperture or slit has disadvantages. Present designs are not compatible with existing planar monolithic silicon integrated circuit technology, thus single planar monolithic IC chip solutions for positioning or navigation using the mechanical aperture technology are not available. The need for a mechanical pinhole or aperture makes this solution physically larger and difficult to form single chip guidance systems and in addition, the requirement for a mechanical slit or aperture makes the embodiment less sensitive to angular changes in incident radiation than it would have to be without the mechanical slit since the mechanical apertures are required to be some fixed physical distance from the detector or sensor surface in order to work. As the requirement for miniaturization increases, the physical size and sensitivity limitations become important and the system cannot be physically reduced enough in size.

What is needed, but currently unavailable in the art, is an improved sun pointing device that is inherently small in size, capable of accurately providing information relating to azimuth and elevation of incident radiation, light weight, has minimal power requirements for its use, capable of being integrated as a monolithic IC in silicon, capable of being scaled to very small dimensions (nanometers) and which does not have the requirement for impinging radiation to pass through a mechanical slit, pin hole or aperture in order to provide azimuth and elevation information. In addition a device is needed which is completely compatible with monolithic integrated circuits technology and which can be integrated into a single piece of silicon to form a single monolithic silicon integrated circuit comprising a guidance system.

It is to the provision of a device capable of providing azimuth and elevation information relative to incident radiation to the surface of a monolithic silicon IC chip, without the use of a mechanical slit or aperture to guide the radiation, that includes integral signal amplification and is capable of being integrated with a single monolithic silicon IC chip with other circuitry that the present invention is primarily directed. The present invention works with radiation incident on the entire detector/sensor surface.

SUMMARY OF THE INVENTION

The present invention recognizes and addresses various of the foregoing limitations and drawbacks, and others, concerning the need for a impingement-independent navigation system suitable for miniaturization using known monolithic silicon IC technology processes. Therefore, the present invention is primarily directed to a monolithic silicon integrated circuit for detecting azimuth and elevation of incident radiation and methods of its manufacture and use.

By employing a three dimensional monolithic silicon structure fabricated in more than a single plane, the present invention provides for directional radiation sensing in more than a single plane providing azimuth and elevation information without the use of mechanical apertures, pinholes or slits. In addition, the present invention is an amplifying device (amplifier) as opposed to a photo diode, which is not an amplifying device, as presented in the prior art. Amplifying devices are known to exhibit lower noise characteristics, which means that such devices are capable of detecting much smaller signals without noise interference. In addition, the present device is capable of being scaled to nanometer dimensions, being fabricated using a planar monolithic silicon IC technology process and being combined with other electronics in a single chip for purposes of navigation, guidance and or control.

One aspect of the present invention is a system and method for determining the azimuth and elevation of radiation impinging the surface of a monolithic silicon Integrated Circuit ("IC"). In order to determine azimuth and elevation of impinging radiation, a sensor detects the angle of incidence of impinging light (radiation) in both an X-Z plane and a Y-Z plane relative to the IC chip surface (the X-Y plane) The rectangular coordinate outputs of the sensors can then be translated into spherical coordinates electronically as required. The angle of incidence information for the X-Z and the Y-Z planes provides the complete azimuth and elevation information.

Another aspect of the present invention is a monolithic silicon based directionally sensitive radiation sensor differential pair ("VCELL") fabricated using essentially conventional monolithic silicon integrated circuit ("IC") technologies. The sensor of the present invention is constructed in a standard single crystalline silicon wafer. Differential pairs are formed in the surface of the integrated circuit chip such that the angle of incidence of impinging radiation can be detected in both an X-Z plane and a Y-Z plane. The differential pairs consist of two NPN phototransistors with the active part of the transistors formed in the <100> crystallographic silicon plane (the X-Y plane) and each transistor formed in the <100> plane having an extension of the P type base region or base extension formed in the <111> plane of the silicon. The <100> and <111> P type base regions are formed in a converging manner at a 54.7° angle. This specific structure is used for convenience in the present device and not a requirement for the device to work. The specific requirement is that the extended base region be in a plane different from the active transistor. Such transistors provide amplification of the detected signals thus improving the noise performance of the device and providing an increased sensitivity to low level radiation signals.

One exemplary embodiment of the present invention, described in greater detail below, is comprised of two bipolar junction transistors configured in a differential amplifier form. The bipolar junction transistors are three-dimensional structures, formed as active amplifiers using standard monolithic planar silicon technology with the exception that the transistors have a base region that extends in a plane different from the active amplifying device. In addition, the extended base region forms a photo detector that produces photo current in response to radiation such as sunlight. In the differential amplifier structure, the opposing bipolar junction transistors have opposing base regions in different planes from each other and in different planes from the active transistors. The structure so described is called a VCELL. Each VCELL structure determines the angle of incidence of light, sunlight or radiation in a plane or a single coordinate of a rectangular coordinate system. Two such devices, organized at any angle greater than zero degrees relative to each other, produce an output which provides both parts of a rectangular coordinate system signal thus providing the azimuth and elevation of incident radiation or providing pointing at incident radiation. Conversion from the rectangular coordinate system signals to azimuth and elevation signals (a spherical coordinate system) requires additional signal processing circuitry. The VCEILL structure of the present invention is compatible with planar silicon monolithic IC processes which are also used to fabricate signal processing and or data conversion circuits. The device as described can be scaled to any dimensions desired, including nanometer dimensions, required by state of the art monolithic silicon integrated circuits. The device described does not require impinging radiation to be mechanically aligned using pinholes, apertures or mechanical slits.

Yet another aspect of the present invention relates to a system that determines the azimuth and elevation of radiation that is impinging the IC device of the present invention. The system includes the monolithic silicon IC device described, infra, that detects the angle of incidence of the impinging radiation in both an X-Z plane and a Y-Z plane. The system further includes a circuit that performs calculations on the angle of incidence information detected by the integrated circuit to determine the azimuth and elevation of the impinging radiation.

Another aspect of the present invention is an IC as described, infra, having two VCELL structures and a reference monolithic silicon transistor. The reference transistor is a phototransistor formed in the <100> plane of the silicon chip without a base extension in a different plane. The reference transistor detects and amplifies impinging radiation to provide a normalization amplitude (or reference) value. When calculating the angle of incidence of the radiation, the signals from each transistor of a single differential pair (VCELL) are subtracted. The difference (the differential output of a single VCELL structure) may be normalized by the output of the reference transistor thus removing radiation amplitude and temperature dependence from the final signal outputs of the sensor when computing azimuth and elevation.

The device, system, and method of the present invention allows for the miniaturization (and/or scaling) of radiation sensing sensors and sun pointing sensors specifically and allows for integration of both a radiation sensor and additional circuitry into a single scaled monolithic silicon chip The miniaturized sensor of the present invention allows for the accurate determination of direction and position of an object relative to a known source of radiation. Further, the present invention provides a small, lightweight, rugged, low power and inexpensive device to be employed in vehicles or systems where size, weight and power are a factor such as vehicles for space applications. In addition to the above, there are many applications for a miniature sun pointer. The miniature sensor may be used to detect increased solar radiation to reconfigure shielding on spacecraft during solar flares and storms. The sensor may also be used to prevent the inadvertent pointing of sensitive optical systems, such as in telescopes, at bright sources of radiation that might cause damage to sensitive detectors within some telescopes.

Finally, the device disclosed herein is designed to be fully compatible as an input sensor to additional gain and/or signal processing circuitry from operational amplifiers to more sophisticated IC chips, including data converters, such as those which support the IEEE 1451 standard for interfacing sensors to networked systems.

Additional advantages of the invention are set forth in, or will be apparent to those of ordinary skill in the art from, the detailed description as follows. Also, it should be further appreciated that modifications and variations to the specifically illustrated and discussed features and materials hereof may be practiced in various embodiments and uses of this invention without departing from the spirit and scope thereof, by virtue of present reference thereto. Such variations may include, but are not limited to, substitutions of the equivalent means, features, and materials for those shown or discussed, and the functional or positional reversal of various parts, features, or the like.

Still further, it is to be understood that different embodiments, as well as different presently preferred embodiments, of this invention, may include various combinations or configurations of presently disclosed features, elements, or their equivalents (including combinations of features or configurations thereof not expressly shown in the figures or stated in the detailed description).

These and other features, aspects and advantages of the present invention will become better understood with reference to the following descriptions and appended claims. The accompanying drawings, which are incorporated in and constitute a part of this specification, illustrate an embodiment of the invention and, together with the descriptions, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 9 is

FIGS. 10A–10H illustrate cross-sectional views taken along line A—A in FIG. 9A of successive process steps for making an exemplary VCELL of the present invention; and FIG. 10I is a cross-sectional view, taken along line A'-A' in FIG. 9A.

Figure 1:
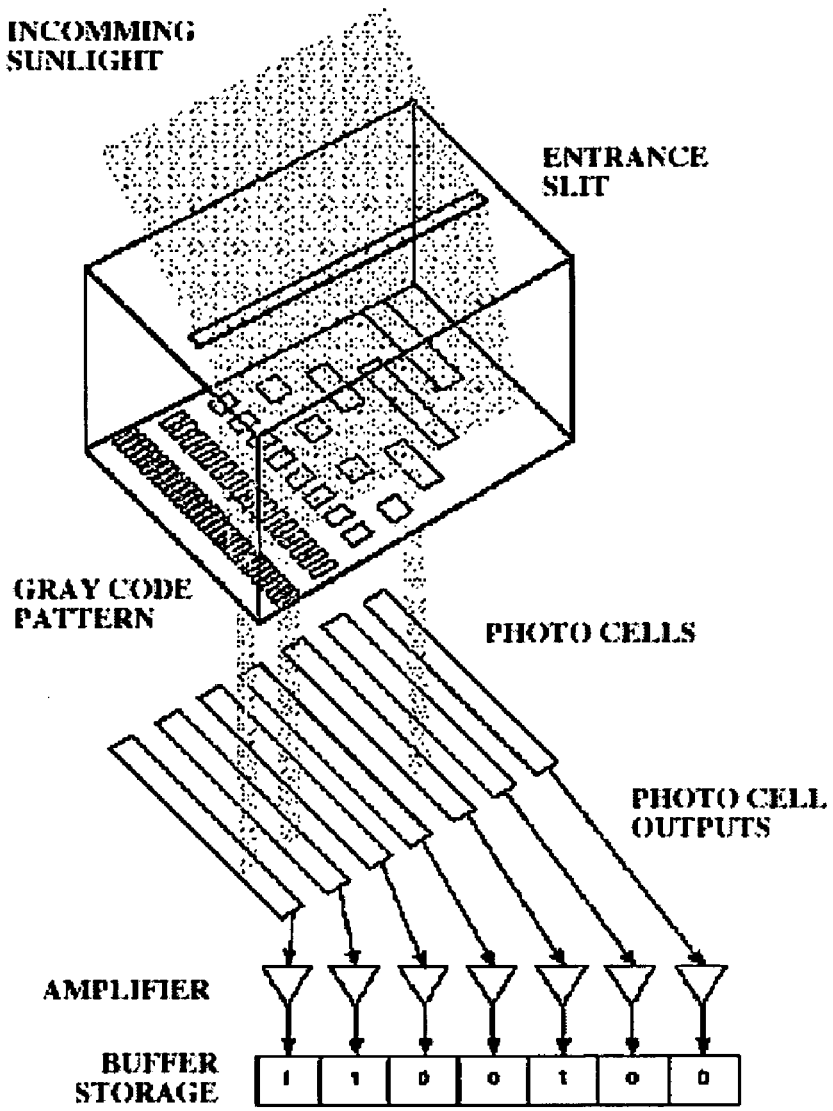
FIG. 1 is a prior art device employing a mechanical slit and electro optical sensors in order to obtain the angle of incidence of impinging radiation.

Repeat use of reference characters throughout the present specification and appended drawings is intended to represent the same or analogous features or elements of the various exemplary embodiments of the present invention described and shown.

DETAILED DESCRIPTION OF THE PREFERRED EMBODIMENTS

Reference will now be made in detail to presently preferred embodiments of the invention, examples of which are fully represented in the accompanying drawings. Such examples are provided byway of an explanation of the invention, not limitation thereof. In fact, it will be apparent to those skilled in the art that various modifications and variations can be made in the present invention, without departing from the spirit and scope thereof. For instance, features illustrated or described as part of one embodiment can be used on another embodiment to yield a still further embodiment. Still further, variations in selection of materials and/or characteristics may be practiced, to satisfy particular desired user criteria. Thus, it is intended that the present invention cover such modifications and variations as come within the scope of the present features and their equivalents.

A monolithic silicon IC 116 in accordance with the present invention includes an X-axis detector 118 capable of detecting the angle of incidence in an X-Z plane of impinging radiation, a Y-axis detector 120 capable of detecting the angle of incidence in a Y-Z plane, and a reference detector 122. The X-axis and the Y-axis detectors, 118 and 120, have dual outputs that are amplified photocurrents caused in the detectors by the impinging radiation. The X-axis detector 118 has output currents $I_{X1}$ and $I_{X2}$. The Y-axis detector 120 has output currents $I_{Y1}$ and $I_{Y2}$. The reference detector is a monolithic silicon phototransistor formed in the <100> plane of the silicon. The reference detector 122 is designed to provide a normalization current, $I_{REF}$, to factor out the amplitude of radiation impinging the surface of the IC and to offset the temperature dependence of the sensor output current.

The net amplified photocurrent computed in the signal processing circuit 124 is $I_X$ where $$I_X = I_{X1} - I_{X2} \quad (1)$$

Therefore, $I_X$ as shown in equation (1) is the differential output of the X-axis detector 118. The normalized photocurrent output of the X-axis detector 118 is given by dividing equation (1) by $I_{REF}$ giving equation (2):

$$I_X/I_{REF} = [I_{X1} - I_{X2}]/I_{REF} \quad (2)$$

The photocurrents produced in the Y-axis detector are denoted as $I_{Y1}$ and $I_{Y2}$. The net photocurrent computed in the signal processing circuit 124 is $I_Y$ where $$I_Y = I_{Y1} - I_{Y2} \quad (3)$$

Therefore, $I_Y$ as shown in equation (3) is the differential output of the Y-axis detector 120. Dividing equation (3) by $I_{REF}$, the same as in equation (2), normalizes the outputs.

$$I_Y/I_{REF} = [I_{Y1} - I_{Y2}]/I_{REF} \quad (4)$$

Although the above discussion is in terms of output emitter currents, these can easily be converted to voltages by circuit designs known to those familiar with the art, such as using current to voltage converters. The divisions in equations (2) and (4) can be done in software or can be accomplished using hardware data converters contained in 124.

Figure 2:
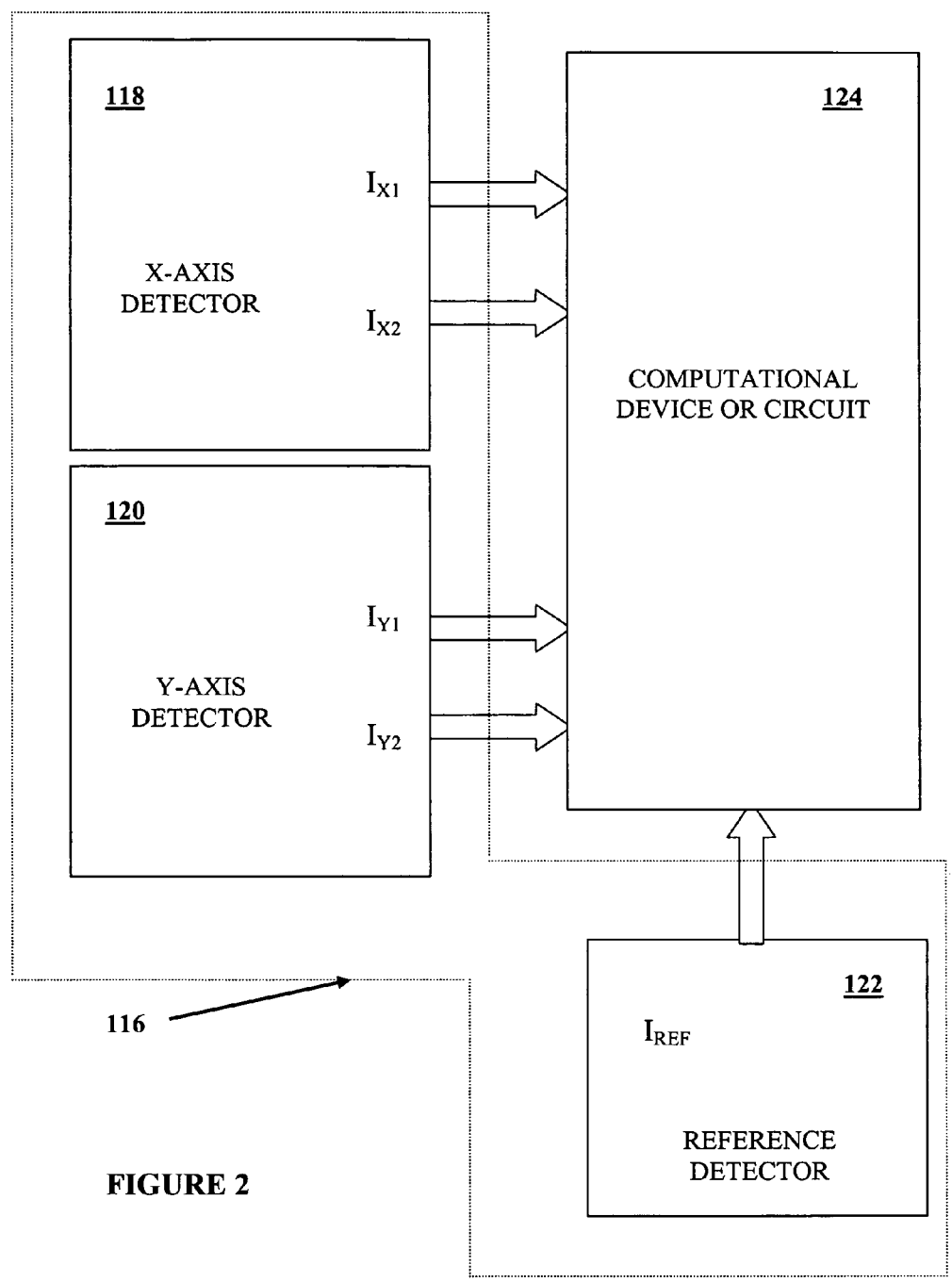
FIG. 2 is a block diagram describing the functionality of an exemplary monolithic silicon integrated circuit sensor in accordance with the present invention and further including its relationship to a computational device or circuit that may be integrated in the same monolithic silicon chip or provided externally as desired for a specific application
Figure 7:
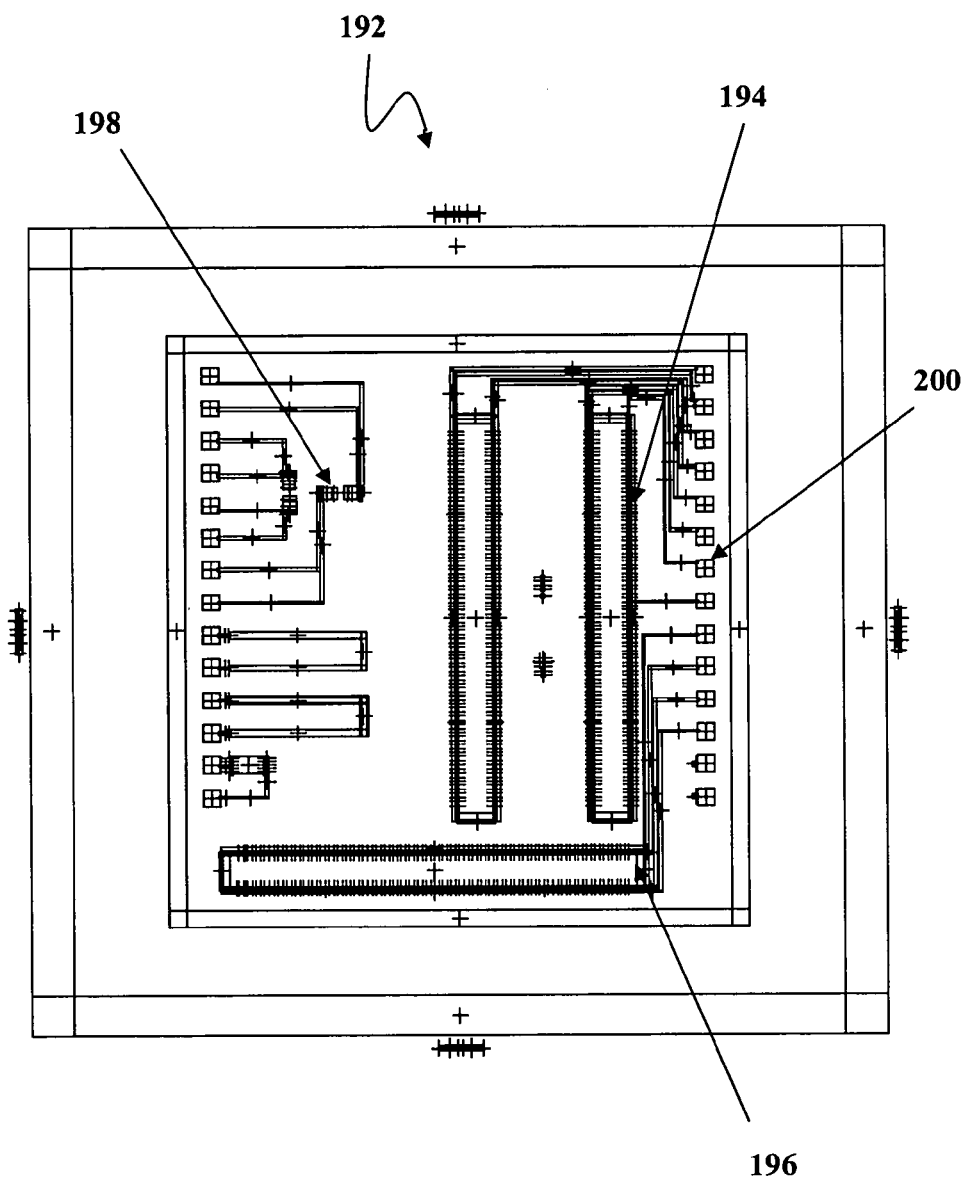
FIG. 7 is a photolithographic mask pattern of an exemplary monolithic silicon integrated circuit (C) of the present invention illustrating three VCELL structures, a reference transistor, some additional test structures, interconnect metallization and bond pads.

A preferred embodiment of the IC 116 can include two directionally sensitive radiation sensors or differential pairs ("VCELL") that are disclosed, supra. A VCELL device is used in the IC 116 as the X-axis detector 118 (FIG. 2), and a VCELL device is used as the Y-axis detector 120 (FIG. 2). A VCELL device detects the radiation in only one axis. Therefore, in order to detect an X-Z plane and Y-Z plane direction, two nonparallel VCELLS are formed in the IC <100> surface as shown in FIG. 7, items 194 and 196.

Figure 3:
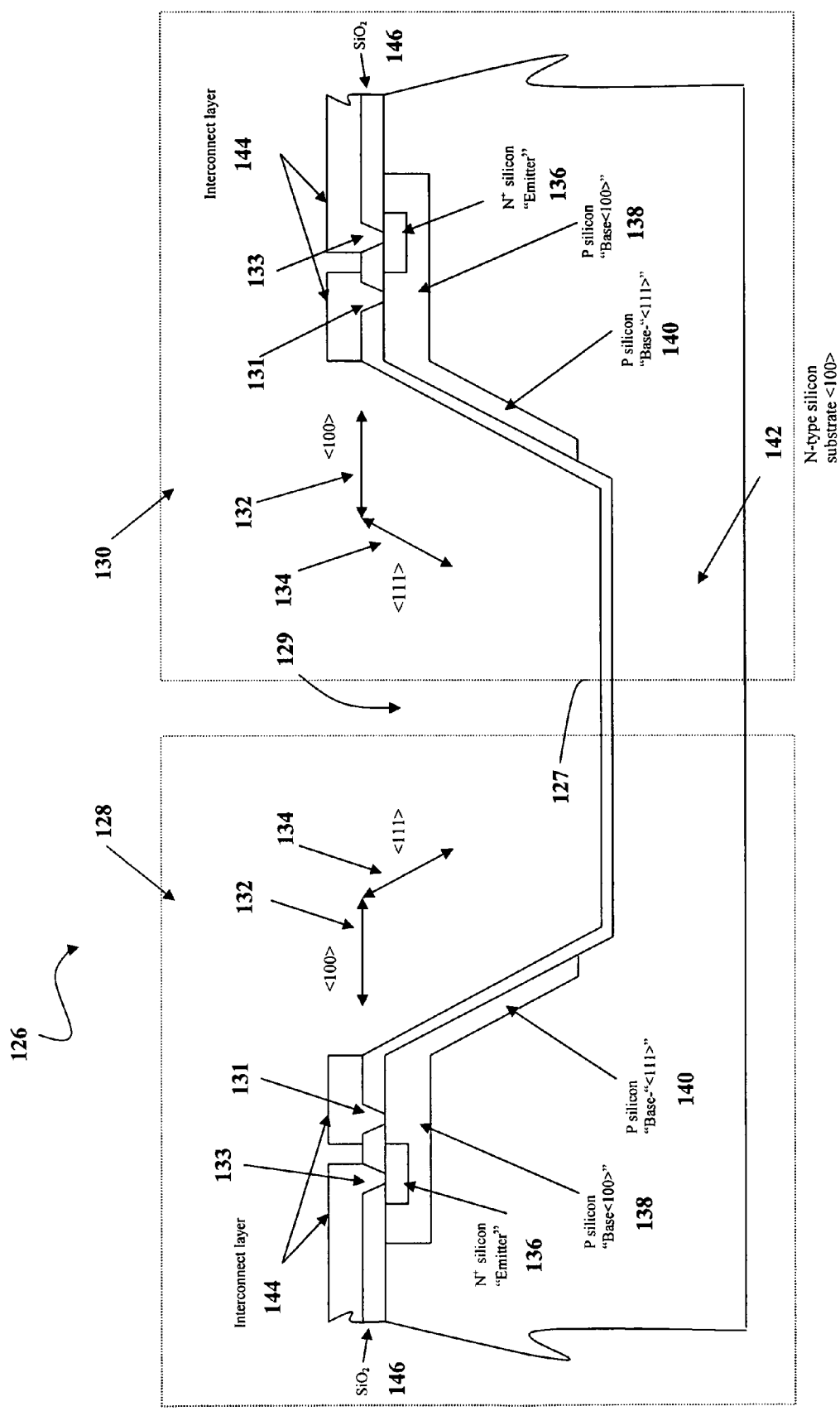
FIG. 3 is a cross-sectional view of an exemplary VCEIL structure of the present invention illustrating two <100> bipolar junction monolithic silicon phototransistors with opposing <111> base extensions (offset from each other by opposing <111> planes or an angle of 70.6 degrees)

A VCELL of the present invention is illustrated in FIG. 3 and is designated generally throughout as reference numeral 126. FIG. 3 is a cross-sectional view of a single VCELL device 126 that is formed as a conventional monolithic silicon IC. The VCELL includes two identical, yet opposing, phototransistors 128 and 130, formed in the silicon wafer. Generally, the active part of the VCEILL transistors (the part which produces transistor action and gain) are formed in the silicon substrate 142 in the <100> plane 132. The <111> plane 134 is the silicon plane that is at an angle of 54.7 degrees from the <100> plane 132. The phototransistors 128 and 130 are formed in the surface of the chip, primarily in the <100> plane, but with a base region extension down the <111> plane 140 such that the P type base regions 140 in the <111> plane 134 are formed opposing and convergent with the <100> base regions 138. The structure formed is a v-groove 129 having a <100> plane horizontal structure 127 at the most convergent point (bottom) of the v-groove.

Each phototransistor 128 and 130 is a bipolar junction transistor having two rectifying PN junctions formed from extrinsic semiconductor materials of the P type and the N type. The phototransistors are NPN transistors. The transistors 128 and 130 are formed on an N type silicon substrate 142. In the present embodiment, the silicon substrate forms the collector of each phototransistor, 128 and 130, however this structure is not required and those knowledgeable in the art will understand that other collector structures are available including those with $N^+$ buried layers. In addition, the phototransistors include a P type base that includes a P type base region 138 in the <100> plane 132 and a P type base extension region 140 in the <111> plane 134. The emitters 136 are heavily doped N type and are formed in the <100> plane, 132. Those knowledgeable in the art will understand that this entire NPN structure can be reversed and a PNP structure used instead.

The phototransistors 128 and 130 that form the VCELL device 126 also include a silicon dioxide ($SiO_2$) layer 146 and an interconnect layer 144 consistent with standard silicon planar process technology. The interconnect layer 144 is typically aluminum, or aluminum with a small amount of silicon (typically 1–2%), deposited as a thin film layer on the chip. The introduction of silicon in the aluminum interconnect layer 144 minimizes surface pitting by the aluminum during processing. It will be known to those knowledgeable in the art that there are several alternatives to forming the metal interconnect and silicon contact structure including the use of barrier layers such as platinum silicide. A second important role for the interconnect layer is that it is designed to minimize the generation of photocurrents in 128 and 130 in the <100> plane 132 when the surface of the chip is exposed to impinging radiation. The active transistor base and active transistor base-collector junction is covered with the metal interconnect thus preventing light or radiation from reaching the base and the base-collector junction of the active transistor (that part of the transistor structure in the <100> plane). In this design radiation only strikes the base-collector junction producing photocurrents in the extended base region in the <111> plane. The interconnect metal connects to the emitter regions 136 and the <100> base regions 138 through contact holes 131 and 133 formed in the $SiO_2$ layer.

The phototransistors 128 and 130 of the VCELL device 126 detect impinging radiation. The impinging radiation is received, at an angle of incidence relative to the ICs surface or the <100> plane, in the <111> P type bases 140. The impinging radiation creates a photocurrent in the PN junction of the P type base 140 and the N type substrate 142. In essence, this PN junction behaves like a photodiode, and it can be modeled as such, providing a photocurrent into the <100> base 138 that is subsequently amplified by the transistor.

Figure 4:
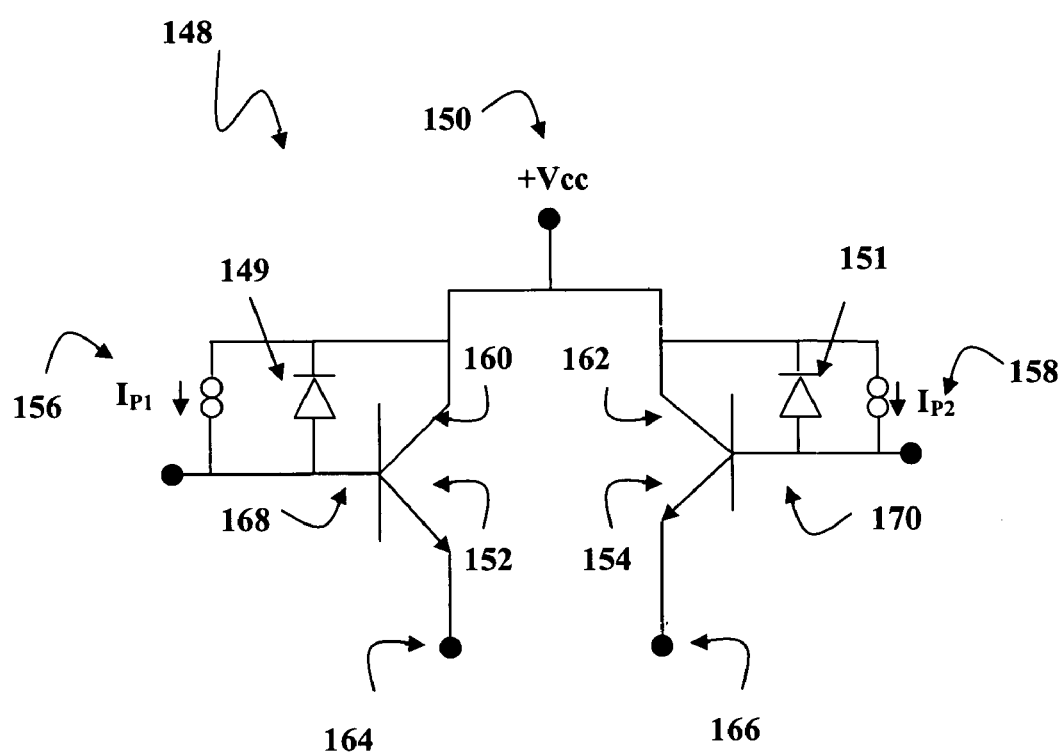
FIG. 4 is a circuit diagram modeling the VCELL structure of one exemplary embodiment of the present invention.

The VCELL device as shown in FIG. 3 is modeled by the equivalent circuit in FIG. 4. The schematic equivalent of the single axis VCELL is designated generally throughout as reference numeral 148. A voltage source $V_{CC}$ 150 provides voltage to the device and by design is the voltage applied to the IC substrate 142. This voltage source can be of a type known to those skilled in the art. The circuit diagram of the single axis VCELL detector includes emitters 164 and 166 corresponding to the N type heavily doped silicon emitters 136 (FIG. 3). The collector regions 160 and 162 correspond to the N type silicon substrate 142 (FIG. 3). In addition, the base terminals 168 and 170 of the VCELL 148 correspond to the P type silicon bases (138 and 140) both in the <100> plane 132 (FIG. 3) and the <111> plane 134 (FIG. 3). The photocurrent sources 156 and 158 modeled in the circuit diagram represent the photocurrent generated by the absorption of the incident radiation by the PN junction formed between the P type silicon bases in the <111> planes 140 and the N-type substrate 142. The transistors 152 and 154 behave as amplifiers, amplifying the photocurrents from the current sources 156 and 158. The PN junction between the P type silicon bases on the <111> planes and the N type silicon substrate are modeled in the circuit by diodes 149 and 151. The model current sources 156 and 158 are connected between the transistor bases 168 and 170 and the transistor collectors 160 and 162 shown in FIG. 4. Additional bias voltages can be applied to the transistors 152 and 154 at their base and emitter terminals 168, 164, 166 and 170, as required, by those skilled in the art.

Figure 5:
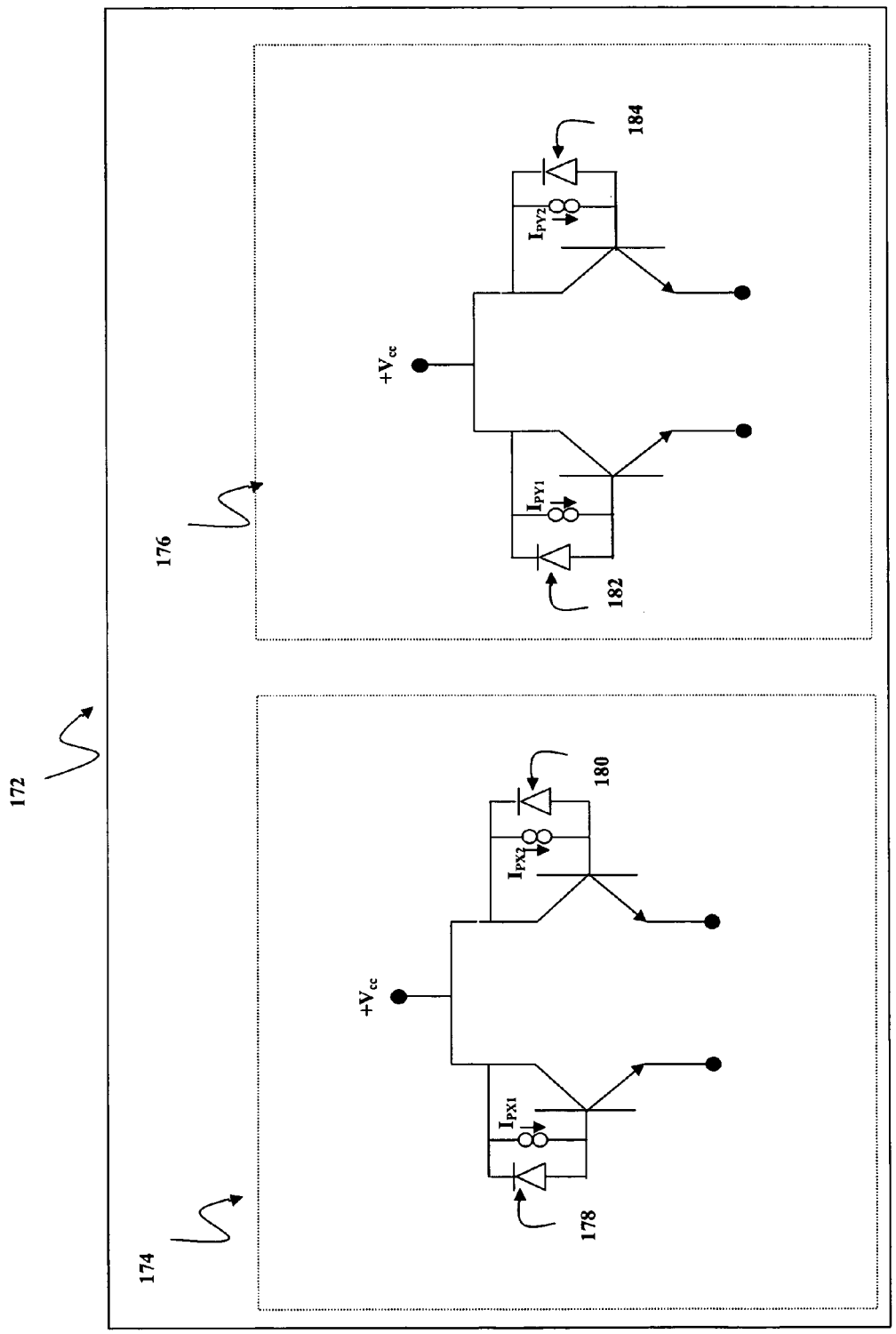
FIG. 5 is a circuit diagram modeling the dual-axes VCELL structure of one exemplary embodiment of the present invention.

FIG. 4 is a schematic drawing of a single axis VCELL. A single VCELL can only detect a single directional dimension of the impinging radiation. Two VCELL devices are required to detect a second directional dimension of the same impinging radiation. FIG. 5 models the dual VCELL device required to receive both a first and second directional dimension of impinging radiation on an IC surface. Dual axes detector 172 includes two VCELL devices 174 and 176. The VCELL devices must be arranged on the IC chip surface so that the devices sense different dimensions of the impinging radiation. Different dimensions of the impinging radiation can be defined by an X-axis directional dimension and a Y-axis directional dimension. Physically, the VCELL detectors must be arranged nonparallel. By design, the nonparallel VCELL detectors have active transistor amplifiers in the <100> plane with offset <111> base extended regions. For example, if the VCELL detectors were arranged parallel, then the devices would receive radiation in the same directional dimension, thereby only detecting a single rectangular coordinate value in a single dimension. To completely determine the angle of elevation and azimuth of the incident radiation, two independent directional measurements are required at different angles to the incoming radiation. This allows calculation of the azimuth and elevation of radiation impinging the surface of the IC.

In general, it is not necessary that the two chosen directional dimensions, X and Y be orthogonal. In the present embodiment, in order to take process (fabrication) advantage of the relationship between the <100> axis and the <111> axis of single crystalline silicon, the X and the Y axes orientations are orthogonal The PN junction of the N type substrate 142 and the P type base 140 in the <111> plane is modeled in the circuit schematic by photodiodes 178, 180, 182, and 184 (FIG. 5). The photocurrent $I_P$, produced by a PN junction such as this can be expressed as a function of the angle of incidence of the radiation, θ', by the following equation:

$$I_P = A^* \sin \theta' \tag{5}$$

In equation (5), the angle θ' is the angle of the incident radiation relative to the <111> plane. If scattering effects (and any other second order effects such as shadowing by surface objects at very small angles of incidence) are neglected, A is essentially independent of θ'. Otherwise, the dependence of A on θ' must be taken into account. This fact does not change the generalized analysis and results presented herein in any significant way for angles of incidence greater than typically a few degrees. If phototransistors or photodiodes are fabricated on different planes in the silicon, then the above expression can be modified to give the value of photocurrents in these devices relative to a reference surface plane. For example, if the reference plane is the <100> plane in silicon 132 (FIG. 3), then the equation, including the offset, for the photocurrent produced along the X-axis, in an offset plane, is:

$$I_P = A^* \sin(\theta_x \pm \text{offset}) \tag{6}$$

where the angle of incidence of the impinging radiation, relative to the <100> plane, is $\theta_x$.

The choice of ± in equation (6) above depends on which opposing plane is chosen. In the presently preferred embodiment, this would be ±54.7 degrees.

Figure 6A:
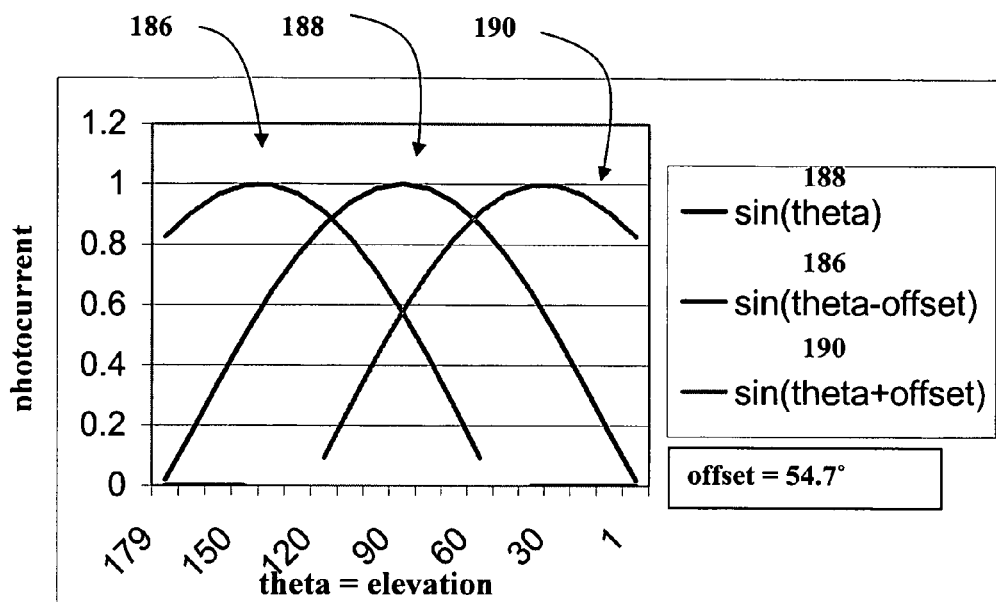
FIGS. 6A & 6B are graphs indicating the first order current behavior of the phototransistors of the IC.

Assuming the configuration as shown in FIG. 2, the device has 3 detectors, an X-axis detector 118, Y-axis detector 120, and a reference detector 122. The photocurrents produced in the X-axis detector are $I_{PX1}$ and $I_{PX2}$. The resulting current behavior, indicated by equation (6), is illustrated in the graph shown in FIG. 6A. The reference transistor photocurrent is indicated by graph line 188. The currents in the current sources $I_{PX1}$ and $I_{PX2}$ are indicated by graph lines 186 and 190. Under the assumption that scattering can be neglected to a first order and also under the assumption that the offset angle is 54.7 degrees (the <111> plane in silicon forms a 54.7 degree angle with the <100> plane), the graph in FIG. 6A defines the current behaviors in the detectors of the individual photodiodes. The plots in the graph in FIG. 6A are shown normalized.

A reference transistor (or detector) 122 (FIG. 2) produces a reference photocurrent, $I_{REF}$. The normalized output of the X-axis VCELL is thus given by the equation:

$$I_{NX} = [I_{X1} - I_{X2}]/I_{REF} \tag{7}$$

which can be written as in equation (8) below:

$$I_{NX} = [(\beta_{X1}+1)(I_{PX1}+I_{S1})+I_{CEO1}-(\beta_{X2}+1)(I_{PX2}+I_{S2})- I_{CEO2}]/[(\beta_{REF}+1)(I_{PREF}+I_{SREF})+I_{CEOREF}] \tag{8}$$

In equation (8), the current gain for each transistor is indicated by the symbol β+1 and has a value typically between 200 and 500. The transistor current gain, β+1 is the relationship between the current entering the active transistor base region and the emitter current of the active transistor. In the present embodiment, the base lead is normally open (no base current except that introduced by the <111> photodiode) and for this case, the total dark (no radiation) emitter current for the active transistor is $(\beta+1)I_S + I_{CEO}$. $I_S$ is the dark reverse leakage current of the extended base region and $I_{CEO}$ is the dark current in the active transistor. In this embodiment, the dark currents cancel out of the numerator in the equation (8) for $I_{NX}$ since by design the opposing active transistors are identical (matched) and thus exhibit the same dark currents. The phototransistors are designed such that, in general, the photocurrents are large compared to dark currents, which are typically on the order of $10^{-12}$ to $10^{-15}$ amps.

The normalized output of the X-axis VCELL is thus given by the equation:

$$I_{NX} = [(\beta_{X1}+1)I_{PX1} - (\beta_{X2}+1)I_{PX2}]/[(\beta_{REF}+1)I_{PREF}] \quad (9)$$

The VCELL sensor is normally operated in a range of photo current such that the transistor current gain of the opposing VCELL transistors and the reference transistor have essentially the same dependence on current. For this case, equation (9) reduces to equation (10):

$$I_{NX} = [I_{PX1} - I_{PX2}]/I_{PREF} \quad (10)$$

Inserting the results from equation (6) gives:

$$I_{NX} = [\sin(\theta_X - 54.7°) - \sin(\theta_X + 54.7°)]/\sin(\theta_X) \quad (11)$$

Figure 6B:
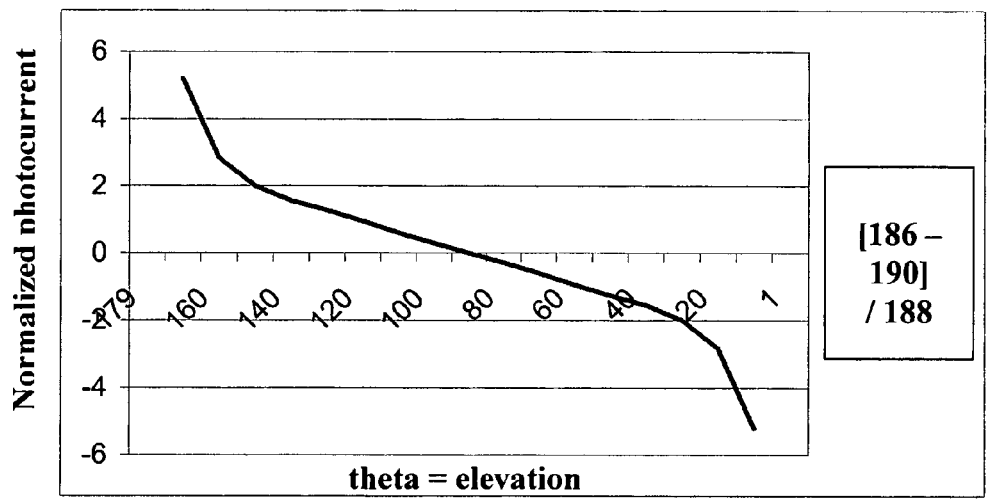

Equation (11), the normalized output $I_{NX}$ is plotted in FIG. 6B. The temperature dependence of $I_{NX}$ is negligible as long as the transistor current gains have the same dependence on current.

An alternative normalization can be accomplished by normalizing using the sum of all currents for one axis. In this alternative case, $$I'_{NX} = [I_{PX1} - I_{PX2}]/[I_{PX1} + I_{PX2} + I_{PREF}] \quad (12)$$

This alternative normalization form of equation (12) is useful when a normalized output that varies from +1 to −1 is required over a range of angle of incidence of 0–180 degrees. The curvature shown in FIG. 6B can thus be avoided as required.

The normalized output of the Y-axis VCELL is:

$$I_{NY} = [I_{PY1} - I_{PY2}]/I_{PREF} \quad (13)$$

From equation (13), the equation for the normalized VCELL output signal for the Y-axis detector is:

$$I_{NY} = [I_{PY1} - I_{PY2}]/I_{PREF} = [\sin(\theta_Y - 54.7°) - \sin(\theta_Y + 54.7°)]/\sin\theta_Y \quad (14)$$

The above equations are not accurate for angles of incidence less than a few degrees. In this case surface-shadowing effects and scattering must be taken into account.

The currents produced by the X-axis detector 118 and the Y-axis detector 120 of FIG. 2 provide the angle of incidence information of the incoming radiation for the two planes, $\theta_X$ and $\theta_Y$, components of the rectangular coordinate system. The computational device 124, as required, can convert from rectangular to polar coordinates. In polar form, the azimuth $\theta_Z$ and the elevation $\phi$ of the incident radiation are provided by applying the following formulas:

$$\tan\theta_Z = \tan\theta_X/\tan\theta_Y; \quad (15)$$

and $$\tan\phi = \{[1/\tan^2\theta_X] + [1/\tan^2\theta_Y]\}^{1/2} \quad (16)$$

The computational device 124 and any additional signal processing electronics can be integrated along with 116 into a single monolithic silicon IC chip. In addition, the output of the computational device 124 can be either analog or digital as desired. All these options are known to those skilled in the art.

All of the above-described photocurrents are multiplied by the current gain factor ($\beta$+1) of the matched transistors that make up the VCELL detectors and the reference detector. The $\beta$+1 current gain factor, shown in equation (9), drops out with normalization. However, in all cases, the actual output of each detector is the emitter current which is equal to the transistor current gain multiplied by the base photocurrent.

The present embodiment includes a base extension that forms the photodiode producing the base currents, which are then amplified by the active transistor. The area of the photodiodes in the present embodiment is $4 \times 10^{-4}$ cm$^2$. This area, when exposed to solar radiation of 1366 W/m$^2$, produces approximately $1 \times 10^{-5}$ amps of base photocurrent. A Gummel Plot of current gain indicates that the active transistor current gain is not dependent on generation-recombination currents in the emitter-base junction for base currents above $1 \times 10^{-8}$ amps. Thus, there is a three order of magnitude range of base currents for which the present device will have active transistor current gains with the same dependence on current and thus for which equations (11) and (14) will be accurate. In addition, these values of base current are also well above the leakage currents in the transistors and the photodiodes, further validating the equations (11) and (14).

The detectable differential emitter current indicated in the numerator of equations (10) and (14) will be limited by the level of electronic noise in the emitter signals. Equations (10) and (14) can be reduced to obtain:

$$\Delta\theta = [(4qI_P\Delta f)^{0.5}]/I_P \quad (17)$$

when the equivalent input noise due to the photocurrents is dominated by shot noise.

In equation (17), $\Delta\theta$ is the minimum detectable change in elevation of the impinging radiation, $I_P$ is the photocurrent in the active transistor base and $\Delta f$ is the noise bandwidth of the VCELL detector. $\Delta\theta$ is on the order of $10^{-4}$ degrees for exposure to solar radiation of 1366 W/m$^2$.

FIG. 7 shows a topographical view of the photolithographic mask pattern 192 used to fabricate the VCELL sensor 116. The reference phototransistor 198, an X-axis VCELL 194 and an orthogonal Y axis VCELL 196 and a typical input/output bond pad 200 are indicated. The area of the test chip shown in FIG. 7 is 1 cm$^2$.

Figure 8:
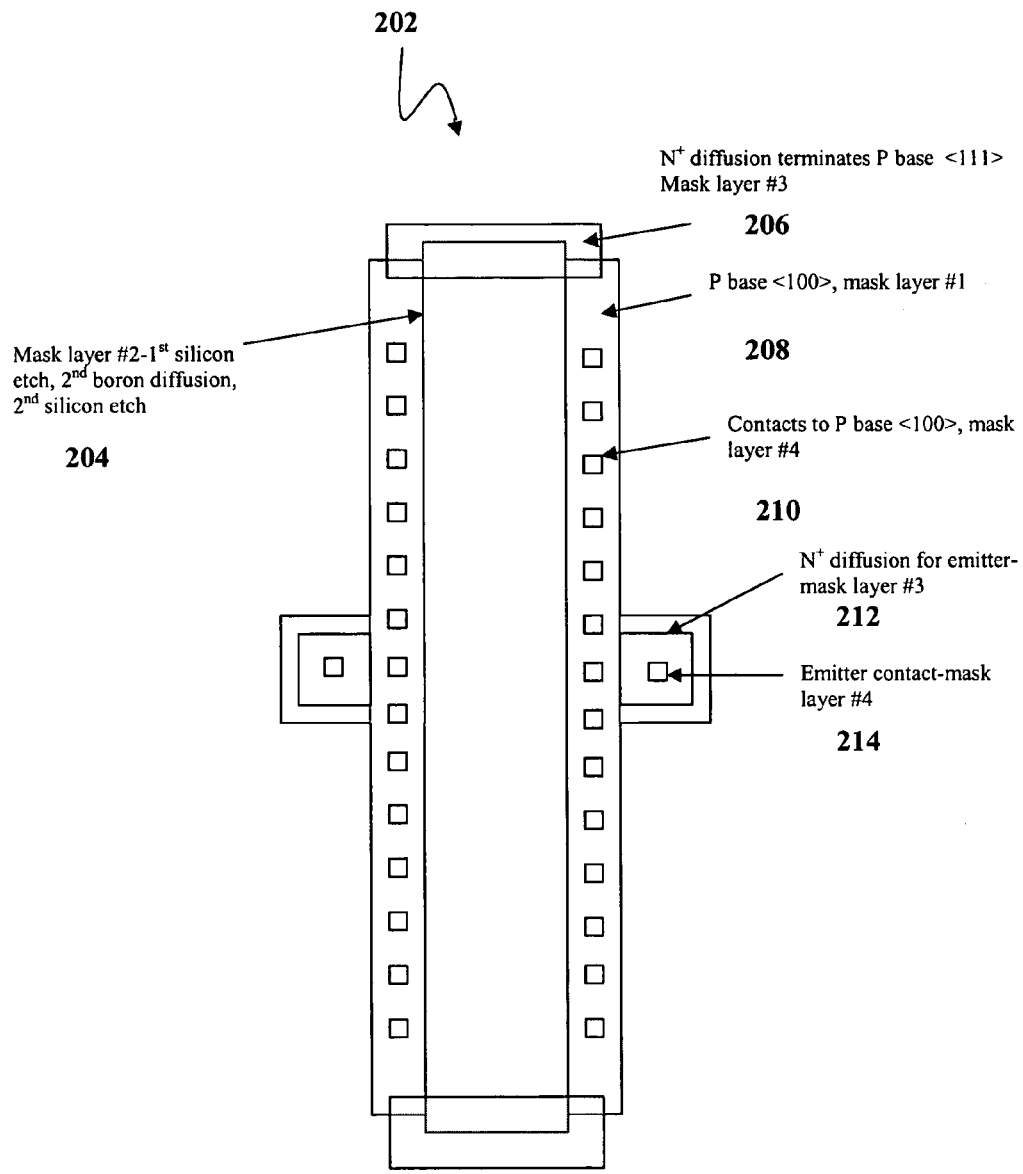
FIG. 8 is a diagram illustrating a topological view of a VCELL structure of the present invention without interconnect metallization.

FIG. 8 provides a more detailed drawing 202 of a VCELL device (none of the following VCELL mask layer figures are drawn to scale). Included in the figure are numerous photolithographic mask layers; a first mask layer 208, a second mask layer 208, a third mask layer 206 and 212, and a fourth mask layer 210 and 214.

Figure 9A:
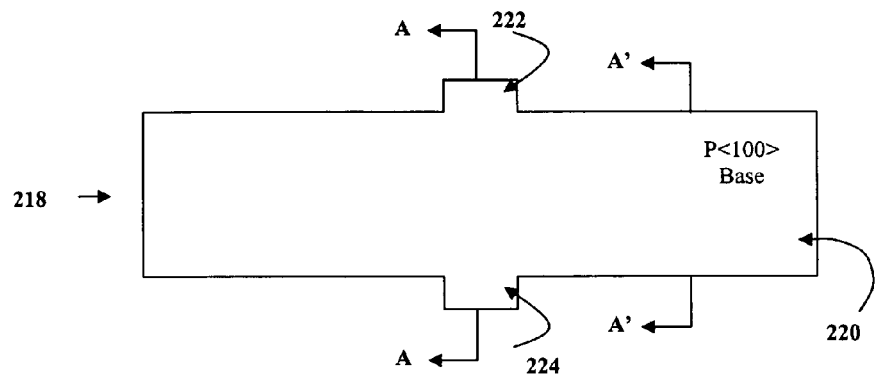
FIGS. 9A–9D are successive partial topological views of the VCELL structure through the photolithographic masking process steps during formation prior to interconnect metal.
Figure 9B:
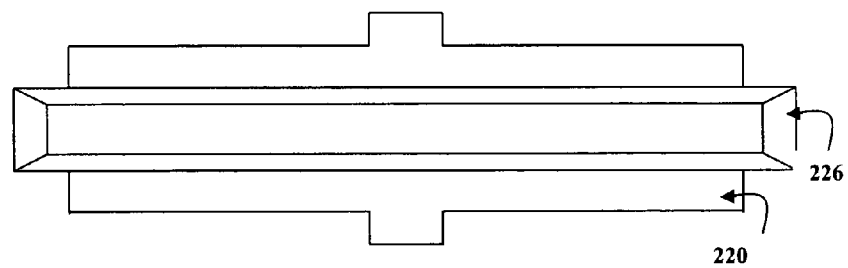
Figure 9C:
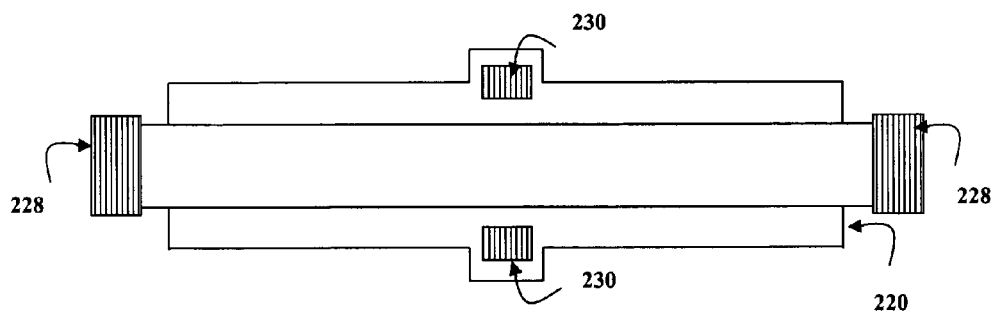
Figure 9D:
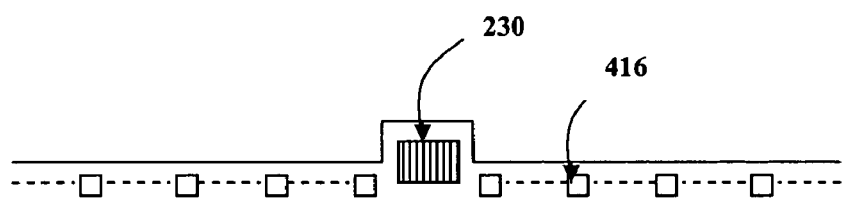

FIGS. 9A–9D show different views of a general VCELL structure indicating the various photolithographic masking patterns used. FIG. 9A shows the first mask shape 218 including the active base regions for the <100> transistors 222 and 224 and the region used to create the <111> base regions for the phototransistors 220. FIG. 9B shows the resultant creation of the <111> plane in the silicon through the use of the second mask layer. FIG. 9C depicts those areas where N$^+$ silicon is formed as a result of using the third mask layer 206 and 212. The phototransistor emitter regions are indicated as 230. Area 228 is used to separate the two VCELL phototransistor <111> base regions. FIG. 9D is a close-up view of contacts 416 to a phototransistor base region next to an emitter area 230.

Figure 10A:
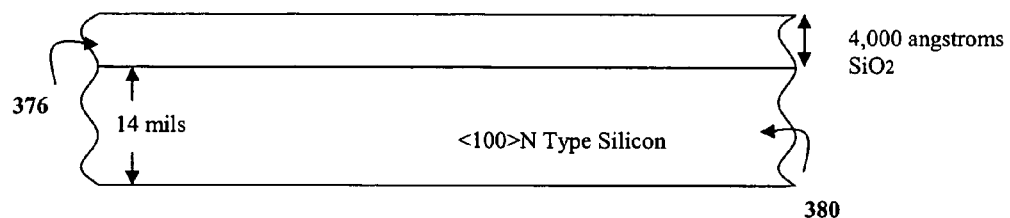
Figure 10B:
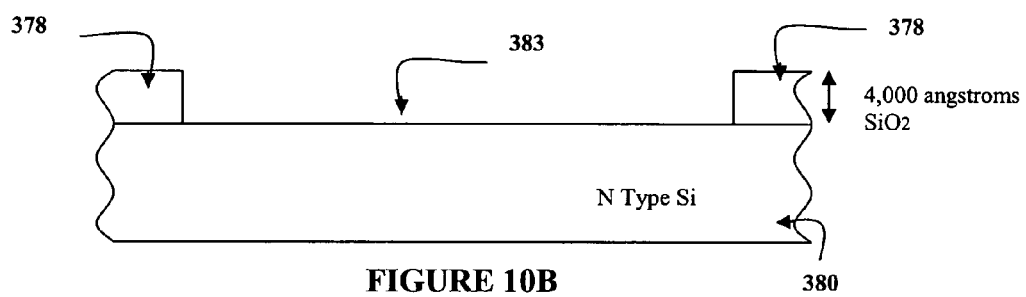

FIGS. 10A–10I provide a series of drawings showing a set of typical process steps for fabricating a general VCELL sensor structure. In FIG. 10A, silicon substrate 380 suitable for monolithic silicon integrated circuit manufacture includes N type silicon with a planar surface with a <100> orientation, and a resistivity of typically 6 ohm-cm. The thickness of the silicon substrate is approximately 14 mils, typical for 3 inch diameter silicon wafers. A Silicon Dioxide ($SiO_2$) layer 400 is formed on the surface of substrate 380 having a thickness of approximately 4,000 angstroms.

A layer of photoresist is applied as a continuous layer on the surface of the $SiO_2$ layer 376 and selectively exposed using a photolithography system. A first mask is used to implement the selective exposure, projecting the image as shown in FIG. 9A. The first mask delineates the areas that will form the first boron deposition. The photoresist is developed and the exposed portions are removed to provide the opening 383 (FIG. 10B) in the remaining oxide 378 after a subsequent oxide etch process. All photoresist masking operations use standard photolithography techniques known to those skilled in the art for silicon planar processing technology.

Figure 10C:
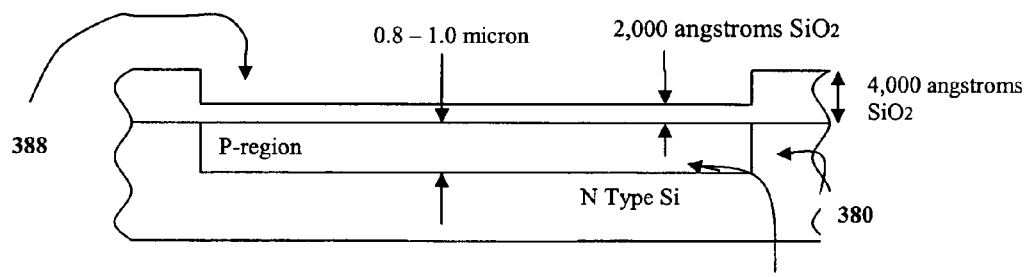

In FIG. 10C, photoresist has been stripped, the oxide aperture has been etched and base region 386 is implanted and diffused into substrate 380 by subjecting the structure to ion implantation of boron and by thermal diffusion by subjecting the wafer to high temperature. The boron deposition and subsequent diffusion/oxidation forms a P-region 386 with a junction depth of 0.8–1 micron and a sheet resistance of approximately 300 ohm/sq. Oxide layer 388 is grown on the substrate 380. The oxide layer has a thickness of approximately 2,000 angstroms over the P region 386.

A layer of photoresist is applied to the silicon substrate 380. A second mask is used to implement the selective silicon <111> etch, resulting in the image as shown in FIG. 9B. The second mask delineates the areas which will receive a first silicon etch, a second boron deposition and a second silicon etch. The base 220 remains as previously developed, and the rectangular image 226 is projected onto the surface of the wafer. Thereafter, the photoresist is developed and the irradiated rectangular portion 226 is ready for subsequent processing.

Figure 10D:
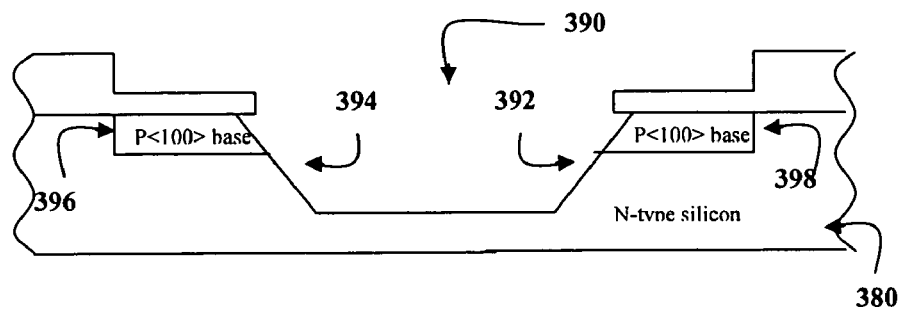

In FIG. 10D the v-groove 390 is preferentially etched (the first silicon etch) forming the opposing convergent sidewalls 394 and 392 oriented in the <111> plane. Etching is performed where the <100> plane is etched approximately thirty (30) times faster than the <111> plane using a wet chemical preferential etching solution of KOH, IPA and $H_2O$ at 80° C. The <111> plane in silicon intersects the <100> plane at an angle of 54.7 degrees. Therefore, the resulting structure is shown with a v-groove having an angular slope from the <100> plane of 54.7 degrees. The first silicon etching separates the boron doped (P type)<100> region 386 (FIG. 10C) into two separate and distinct P type base regions in the <100> plane, 396 and 398.

Figure 10E:
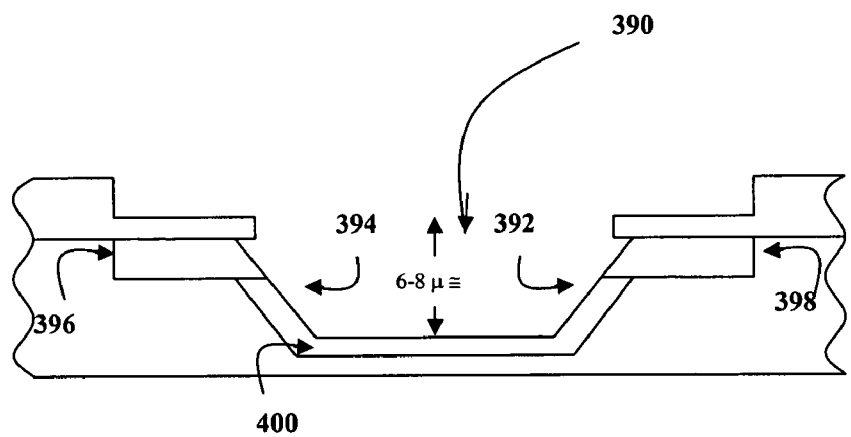

In FIG. 10E a second doped P type region 400 is implanted into substrate 380 by subjecting the structure to ion implantation of boron or by thermal deposition and diffusion/oxidation with a boron dopant source such as boron nitride wafers. The second Boron deposition forms a P type region in the <111> planes 394 and 392 as well. The second P type regions 394 and 392 have a junction depth of less than 1.0 micron.

Figure 10F:
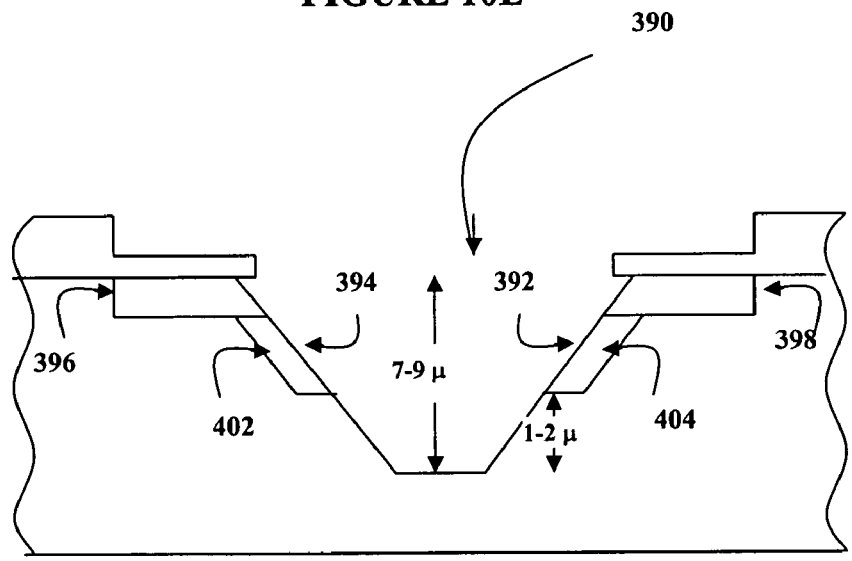

In FIG. 10F, a second silicon etch is performed on the v-groove 390 providing additional depth of 1µ (microns). This further etching allows for the separation of the boron doped P region 400 leaving only a P type base region 402 on the <111> plane and a P type base region 404 on the opposing <111> plane. The opposing P type base regions on the opposing <111> planes form part of the base regions of the NPN phototransistors.

In FIG. 10G, an oxide layer 403 is grown on the bare silicon regions in the v-groove 390. The oxide layer has a thickness of approximately 2,000 angstroms. This oxidation masks the silicon surfaces such that when masking the surface to apply the $N^+$ depositions and subsequent anneals, the doping will not penetrate areas other than those to be doped.

A layer of photoresist is applied across the entire wafer. A third mask is used when implementing the next photolithographic process, creating the image as shown in FIG. 9C. This masking step delineates the regions where the $N^+$ doped areas 230 and 228 (FIG. 9C) are formed. The $N^+$ regions are formed using either ion implantation or thermal diffusion using a source of phosphorous or arsenic or both. The $N^+$ regions 230 form the emitters for the bipolar phototransistors. The $N^+$ regions 228 provide a means of separation between the boron doped P type <111> planes formed in FIG. 9B by the end sections of 226. This provides that the phototransistor devices are conductively isolated from each other. The base 220 remains as previously formed.

With reference to FIG. 10G, the photoresist is developed and the irradiated portions are removed providing the openings 406 and 407 for emitters after an oxide etch process.

The heavily doped $N^+$ regions 408 and 410 are formed in substrate 380 by subjecting the structure to ion implantation or thermal diffusion of phosphorous or arsenic. In addition, with reference to FIG. 9C, the end regions of the v-groove 228 are heavily doped in order to terminate the p type <111> base regions (converting the P regions in this area back to N regions). The arsenic or phosphorous depositions form $N^+$ regions, 408 and 410, that serve as the emitters of the phototransistors. The $N^+$ regions have a junction depth of approximately 1.0–1.5 microns.

With reference to FIG. 10I, a layer of photoresist is applied on the silicon and a fourth mask is used to create the contact openings 416 to the P type base regions and 418 to $N^+$ emitter regions. The photoresist is selectively exposed using the photolithography system and the fourth mask, then the exposed portions are removed to provide a consecutive line of openings to serve as the P type base contacts 416 and provide all contacts to the N type material, including the $N^+$ emitters.

FIG. 9D illustrates the placement of the P type base contacts 416 along the substrate surface. The consecutive arrangement minimizes the effect of base resistance by reducing the series resistance inherent in the silicon material used in the P type base regions, 402, 404, 396 and 398. (FIG. 10F).

Further processing steps in the fabrication of planer monolithic silicon ICs are known in the art and further include forming an interconnect metallization layer forming contacts to the the P type base regions 416 (FIG. 10I) and the $N^+$ emitters 408 and 410 (FIG. 10H), then masking the interconnect metallization pattern to form the interconnects to the bond pads on the chip.

Generally, the exemplary embodiment described herein includes a monolithic silicon integrated circuit device having three phototransistors including two <100> phototransistors having bipolar junction transistors with base regions extended in the <111> plane and a reference phototransistor fabricated in the <100> plane. One of ordinary skill in the art will recognize that the v-groove structure disclosed that makes up the opposing and convergent P type base region extensions of the phototransistors can be made using various planes, surfaces and geometric configurations. The present invention is not limited to P-type base regions formed in a <111> plane. In addition, one of ordinary skill in the art will recognize that the choice of bipolar junction phototransistors is also not limiting. Other devices, PNP (as opposed to NPN as described) transistors, MOSFETS, or other types of devices can be employed to serve the function of the NPN phototransistor amplifiers in the preferred embodiment.

Also, various methods of processing are available in the art to form other various planes, surfaces or geometric configurations. For example, methods including ion milling, plasma etching, micro-electro-mechanical structuring (MEMS), or micro-machining are available to form various other planes, surfaces and geometric configurations. The present invention is not limited to the crystallographic method described herein. The embodiment disclosed herein is an exemplary embodiment of the present invention.

In addition, the present invention includes other numerous variations available to the embodiment described herein. For instance, the monolithic silicon IC can include a single VCELL device or numerous VCELL devices on the surface of the chip depending upon the application required of the IC. In addition, when required, the VCELL structure can be halved such that it is formed using on a single transistor structure thus eliminating the differential transistor structure. The system of the present invention can employ various kinds of devices to perform the calculations required for determining azimuth and elevation, including a microprocessor or a ROM device.

Although a preferred embodiment of the invention has been described using specific terms and devices, such descriptions are for illustrative purposes only. The words used are words of description rather than of limitation. It is to be understood that changes and variations may be made by those of ordinary skill in the art without departing from the spirit or the scope of the present invention, which is set forth in the following claims. In addition, it should be understood that aspects of various other embodiments may be interchanged both in whole or in part. Therefore, the spirit and scope of the appended claims should not be limited to the description of the preferred version contained herein.

What is claimed is:

1. A device for detecting radiation, said device comprising:
   a monolithic silicon integrated circuit;
   a first sensor formed in said monolithic silicon integrated circuit for detecting a first component of radiation that is emitted by a radiation source and impinges on the surface of the sensor without being mechanically aligned by passing through an aperture;
   a second sensor formed in said monolithic silicon integrated circuit, said second sensor positioned with respect to the first sensor to detect a second component of the radiation that is emitted by the radiation source and impinges on the surface of the sensor without being mechanically aligned by passing through an aperture, wherein said first and second sensors are constructed and arranged to cooperate with one another to determine the location of the source of origin of the radiation.

2. A device for detecting radiation, said device comprising:
   a monolithic silicon integrated circuit; and
   a first and second sensor formed in the monolithic silicon integrated circuit for sensing a first and second component of radiation that is emitted by a radiation source and impinges on the surface of the sensor without being mechanically aligned by passing through an aperture, said first and second sensors positioned with respect to one another to determine the location of the source of origin of the radiation.

3. A system for determining the location of origin of incident radiation, said system comprising:
   a monolithic silicon integrated circuit;
   a first and second sensor formed in the monolithic silicon integrated circuit and being positioned on said integrated circuit to detect the X and the Y components of radiation impinging on the surface of said sensors without being mechanically aligned by passing through any aperture; and
   a circuit connected to said first and second sensor outputs, said circuit adapted to calculate the azimuth and elevation of incident radiation.

4. A system for determining the location of the source of origin of radiation comprising:
   a monolithic silicon integrated circuit;
   a first and second sensor formed in the monolithic silicon integrated circuit and positioned for detecting a first and second component of incident radiation without the need for mechanical alignment by passing the radiation through any apertures; and
   means for calculating the azimuth and elevation of the incident radiation from the first and second directional components detected by the first and second sensors.

5. A method for detecting radiation comprising the steps of:
   detecting a first and second component of incident radiation on a monolithic silicon integrated circuit, wherein the incident radiation is not mechanically aligned by passing through an aperture; and
   outputting from the monolithic silicon integrated circuit photocurrents corresponding to the first and second components of the impinging radiation, to calculate azimuth and elevation of the incident radiation.

6. A method for determining the location of the source of origin of radiation, said method comprising the steps of:
   detecting a first and second component of incident radiation on a monolithic silicon integrated circuit without mechanically aligning the radiation by passing it through an aperture; and
   calculating azimuth and elevation of incident radiation from the first and second components.

7. A device for detecting the direction of radiation, said device comprising:
   a monolithic silicon integrated circuit;
   a first detector formed in the monolithic silicon integrated circuit having a first output that indicates a first dimensional direction of incident radiation; and
   a second detector formed in the monolithic silicon integrated circuit, said second detector positioned and arranged with respect to said first detector and having a second output indicating a second dimensional direction of the incident radiation, wherein said first output and said second output provide the azimuth and elevation of the radiation, and wherein the first detector and second detector operate without mechanical alignment of the incident radiation by passing through an aperture.

8. A device for detecting the direction of incident radiation as claimed in claim 7 wherein said first and second detectors are positioned nonparallel with respect to each other.

9. A device for detecting the direction of incident radiation as claimed in claim 8, wherein said first detector includes two bipolar junction phototransistors having opposing and convergent base regions such that impinging radiation produces an amplified photocurrent in each of said bipolar junction phototransistors and said first output is a differential current output indicating the angle of incidence of the impinging radiation in the first dimensional direction.

10. A device for detecting the direction of radiation as claimed in claim 9, wherein said second detector includes two bipolar junction phototransistors having opposing and convergent base regions such that impinging radiation produces an amplified photocurrent in each of said bipolar junction phototransistors and said second output is a differential current output indicating the angle of incidence of the impinging radiation in the second dimensional direction.

11. A device for detecting the direction of radiation as claimed in claim 10, said device further including a reference monolithic silicon detector, said reference detector integrally producing an amplified current output.

12. A device for detecting the direction of radiation as claimed in claim 11 further including a computational device that normalizes said first and second differential current outputs by dividing the differential current outputs by the reference detector current output, and that translates said differential outputs into azimuth and elevation of incident radiation.

13. A system for determining the azimuth and elevation of incident radiation, said system comprising:
  a monolithic silicon integrated circuit having a first and second detector for detecting a first and second dimension of the direction of the incident radiation, said first and second detector having integrally amplified differential current outputs indicating a first directional component and a second directional component of the radiation, and wherein the first and second detectors operate without requiring mechanical alignment of incident radiation by passing through any apertures;
  a reference detector having an amplified current output; and
  a computational device that normalizes said amplified differential current outputs by dividing said amplified differential outputs by the amplified current output of said reference detector and further translating said differential outputs into azimuth and elevation of incident radiation.

14. A system for detecting the azimuth and elevation of radiation as claimed in claim 13 wherein said first and second monolithic silicon detectors are positioned nonparallel with respect to each other.

15. A system for detecting the azimuth and elevation of radiation as claimed in claim 14 wherein said first detector includes two bipolar junction phototransistors having opposing and convergent base regions such that incident radiation produces an amplified photocurrent in each of said bipolar junction phototransistors and said first output is a differential current output indicating the angle of incidence of the first dimension of the direction of the incident radiation.

16. A system for detecting the azimuth and elevation of radiation as claimed in claim 15 wherein said second detector includes two bipolar junction phototransistors having opposing and convergent base regions such that impinging radiation produces an amplified photocurrent in each of said bipolar junction phototransistors and said second output is a differential current output indicating the angle of incidence of the second dimension of the direction of the incident radiation.

* * * * *